United States Patent
Hand et al.

(10) Patent No.: US 7,196,650 B1
(45) Date of Patent: Mar. 27, 2007

(54) SIGNAL CONVERTER SYSTEMS AND METHODS WITH ENHANCED SIGNAL-TO-NOISE RATIOS

(75) Inventors: James Hand, Greensboro, NC (US); Glenn M. Romano, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/342,060

(22) Filed: Jan. 27, 2006

(51) Int. Cl.
*H03M 1/12* (2006.01)

(52) U.S. Cl. ............... 341/155; 341/141; 341/143

(58) Field of Classification Search ............ 341/141
See application file for complete search history.

(56) References Cited

U.S. PATENT DOCUMENTS

| | | | |
|---|---|---|---|
| 5,323,157 A * | 6/1994 | Ledzius et al. | 341/143 |
| 5,568,142 A * | 10/1996 | Velazquez et al. | 341/126 |
| 6,339,390 B1 * | 1/2002 | Velazquez et al. | 341/120 |
| 6,344,810 B2 | 2/2002 | Velazquez et al. | 341/138 |
| 6,392,575 B1 | 5/2002 | Eklund | 341/141 |
| 6,476,749 B1 | 11/2002 | Yeap et al. | 341/155 |
| 6,501,406 B1 | 12/2002 | Mecchia | 341/143 |
| 6,542,017 B2 | 4/2003 | Manganaro | 327/291 |
| 6,545,626 B1 * | 4/2003 | Nakada | 341/155 |
| 6,559,781 B2 | 5/2003 | Freidhof | 341/61 |
| 6,567,022 B1 | 5/2003 | Reuveni et al. | 341/120 |
| 6,567,030 B1 | 5/2003 | Pupalaikis | 341/155 |
| 6,600,438 B2 * | 7/2003 | Hilton | 341/155 |
| 6,606,048 B1 | 8/2003 | Sutardja | 341/155 |
| 6,643,675 B2 | 11/2003 | Piirainen | 708/313 |
| 6,707,255 B2 | 3/2004 | Coumou et al. | 315/111.41 |
| 6,788,233 B1 | 9/2004 | Quiquempoix | 341/143 |
| 6,831,900 B2 | 12/2004 | Blake | 370/289 |
| 6,956,517 B1 | 10/2005 | Baker et al. | 341/155 |
| 7,049,992 B1 * | 5/2006 | Hilton | 341/155 |

OTHER PUBLICATIONS

Looney, Mark, "Advanced Digital Post-Processing—in Time-Interleaved ADC Systems", Analog Dialogue, vol. 37, Aug., 2003, 5 pages.
"Multiply Your Sampling Rate with Time-Interleaved Data Converters", Maxim Integrated Products, Inc., Sunnyvale, California, Application Note 384, Mar. 1, 2001, 6 pages.
Velazquez, Scott R., "Design of Hybrid Filter Banks for Analog/Digital Conversion", IEEE Transactions on Signal Processing, vol. 46, No. 4, Apr. 1998, p. 956-967.
Velazquez, Scott R., et al., "Integration of Advanced Digital Signal Processing Techniques—Enhances ADC Capabilties", GSP 2004 Conference Paper, Sep. 30, 2004, 5 pages.
Donadio, Matthew P., "CIC Filter Introduction", pp. 1-6, Iowegian Free Publication available at dspguru.com, Jul. 18, 2000.
Cascaded Integrator-Comb (CIC) Filter, product specification, pp. 1-18, Xilinx, Inc., San Jose, CA, Mar. 14, 2002.
Lyons, Richard, "Understanding Cascaded Integrator-comb Filters", Embedded Systems Design Magazine, pp. 1-11, Mar. 31, 2005.

* cited by examiner

*Primary Examiner*—Khai M. Nguyen
(74) *Attorney, Agent, or Firm*—Koppel, Patrick, Heybl & Dawson

(57) ABSTRACT

Signal converter systems are provided with N analog-to-digital converters that respectively respond to N interleaved clock signals which have a common clock frequency and are further provided with a filter network that processes the converters' output digital sequences with a selected filter passband a filter passband that is contained within a single one of Nyquist zones whose widths are one half of the clock frequency and that is positioned to pass information contained in the analog signal. In a system embodiment, the filter network comprises a symmetric systolic finite impulse response filter arranged to define N input ports for reception of the digital sequences.

20 Claims, 9 Drawing Sheets

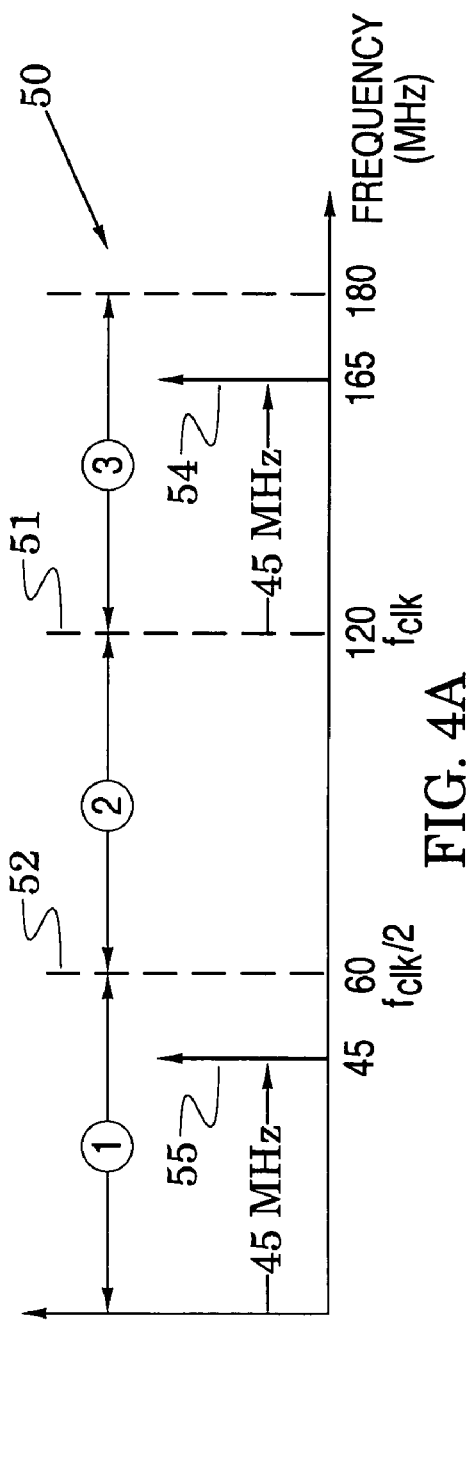
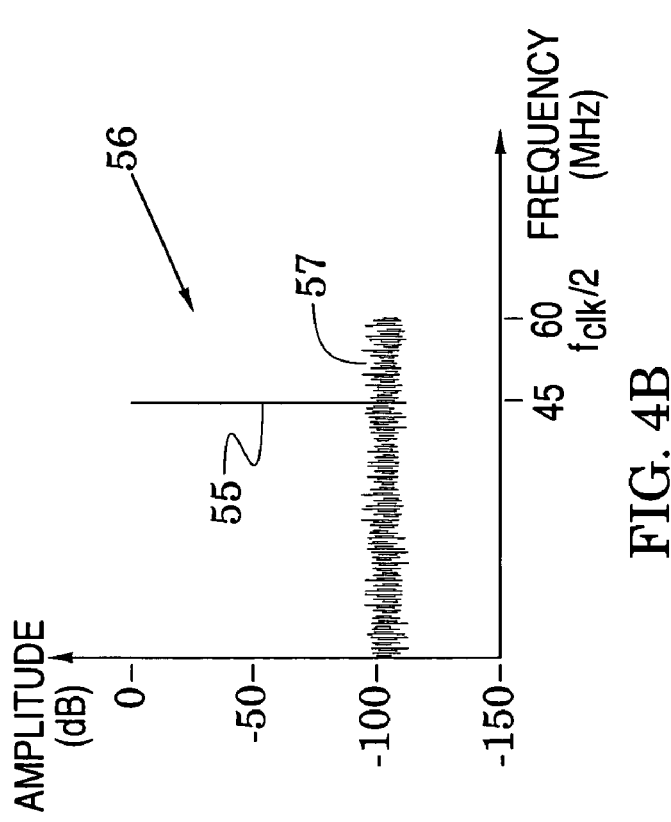
FIG. 4A
FIG. 4B

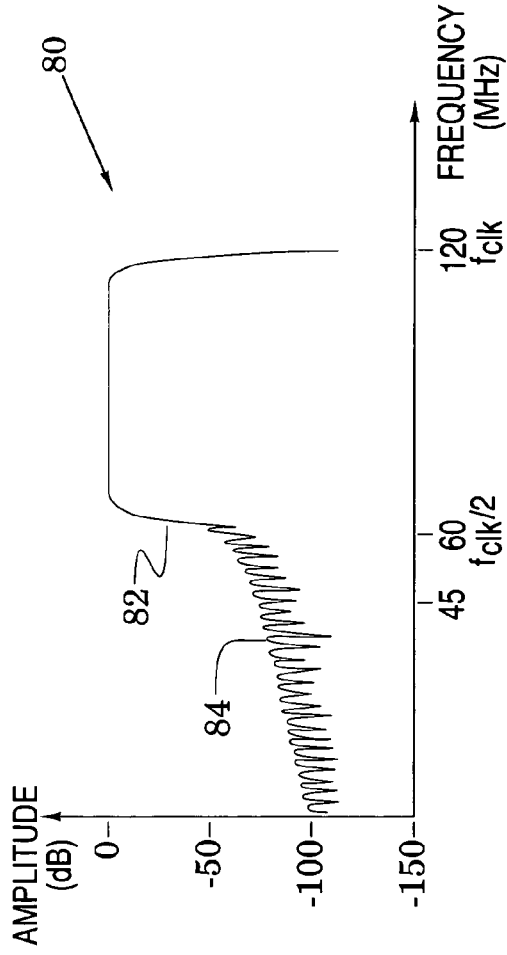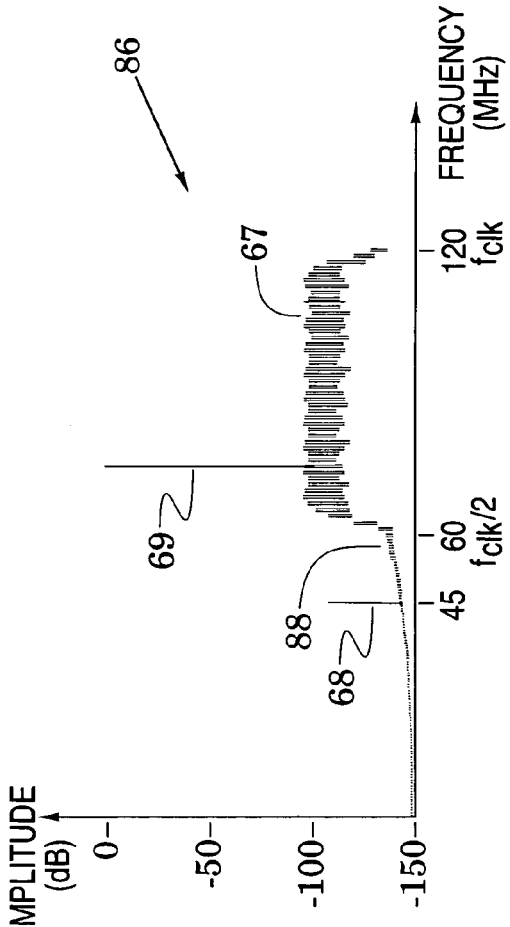
FIG. 6A
FIG. 6B

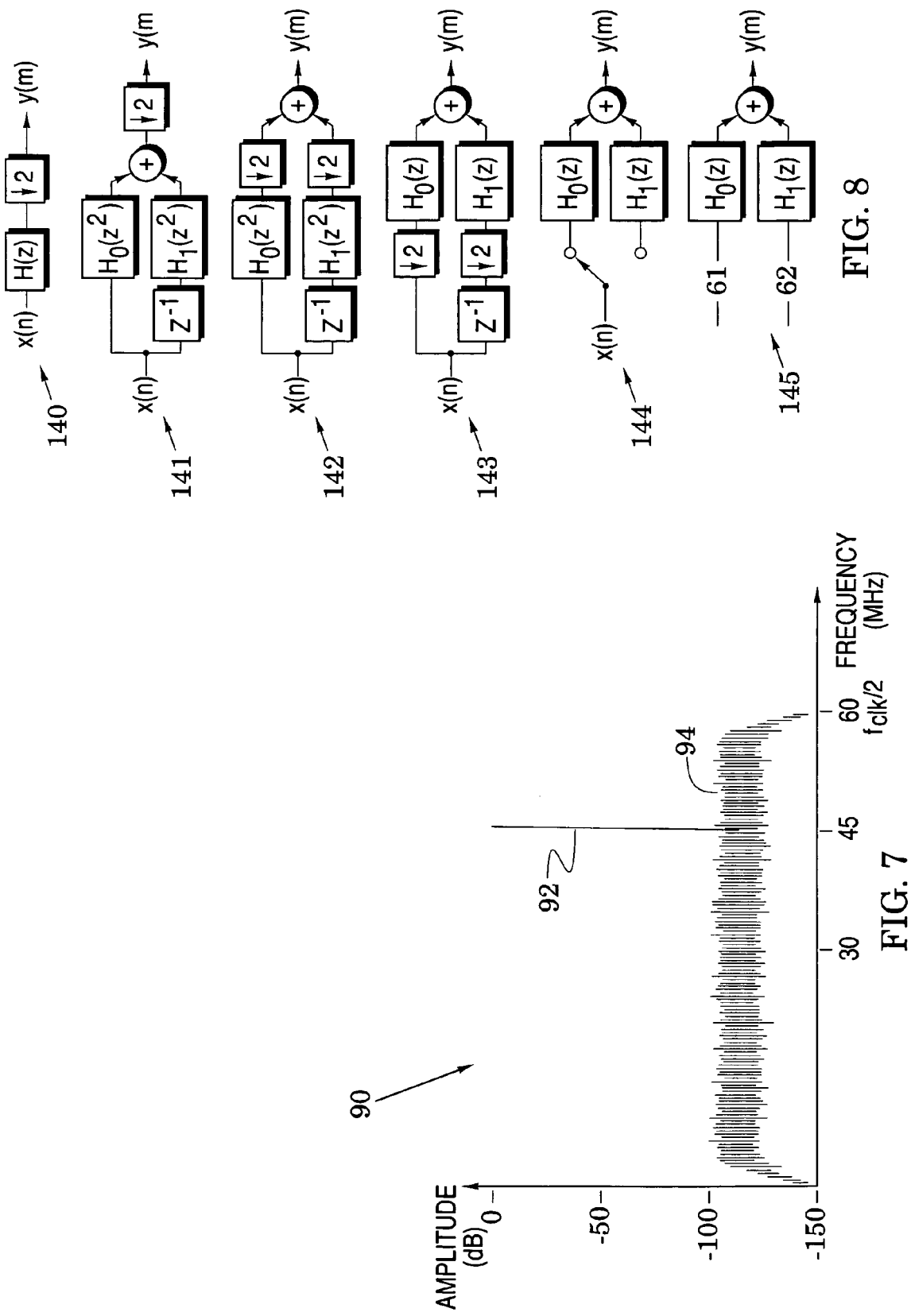

SIGNAL CONVERTER SYSTEMS AND METHODS WITH ENHANCED SIGNAL-TO-NOISE RATIOS

BACKGROUND OF THE INVENTION

1. Field of the Invention

The present invention relates generally to signal converters.

2. Description of the Related Art

Multichannel signal converter systems are generally arranged in averaging configurations or in time-interleaving configurations. The first approach increases resolution without loss of speed while the second approach increases sampling rates without loss of resolution. In averaging techniques, N signal converters are clocked by a common clock signal. Output signal energy adds directly while noise sums as the root-sum-square of each output noise. As long as quantization noise is substantially greater than noncorrelated noise (e.g., thermal noise), noise power is substantially reduced.

In contrast, time interleaving N signal converters increases the system sample rate by N so that the system Nyquist frequency increases by N and noise is spread over the greater bandwidth so that the noise in a specific signal bandwidth is decreased. Interleaved signal converters can substantially increase the system signal-to-noise and, unlike converter averaging, this increase is realized regardless of the noise source. A downside of time interleaving is that mismatches between the converters' gain, phase and offset generate nonharmonic spurious output signals.

Although time interleaved signal converters offer significant operational advantages, their realization has often been structurally complex and expensive.

BRIEF SUMMARY OF THE INVENTION

The present invention is directed to signal converter systems that realize enhanced signal-to-noise ratios with relatively simple structures. The novel features of the invention are set forth with particularity in the appended claims. The invention will be best understood from the following description when read in conjunction with the accompanying drawings.

BRIEF DESCRIPTION OF THE DRAWINGS

FIGS. 4A and 4B are frequency diagrams that illustrate operations of any one of the signal converters in the system of FIG. 1;

FIGS. 6A and 6B are frequency diagrams that illustrate exemplary operations of a digital filter in the system of FIG. 1;

FIG. 7 is a frequency diagram that illustrates exemplary operations of a downsampler in the system of FIG. 1; and FIG. 8 shows other filter arrangements for the system of FIG. 1.

DETAILED DESCRIPTION OF THE INVENTION

FIGS. 1–7 illustrate signal converter systems and methods that convert analog signals to corresponding digital codes while facilitating enhanced signal-to-noise ratios in the digital codes. In system embodiments, digital sequences are generated in response to the analog signals and to interleaved clock signals that each operate at a clock frequency. In at least some of the embodiments, the rates of these digital sequences are increased to realize enhanced-rate sequences and a sum of the enhanced-rate sequences is passed through a digital filter to provide a filtered sequence.

Generally, the width of the digital filter's passband does not exceed one half of the clock frequency and is contained within a single one of Nyquist zones that are defined by the clock frequency (e.g., a first Nyquist zone is the region below one half of the clock frequency, the second Nyquist zone is the region between one half of the clock frequency and the clock frequency and so on). Finally, the rate of the filtered sequence is reduced to provide digital code at a code frequency that substantially equals the clock frequency.

Figure 1:
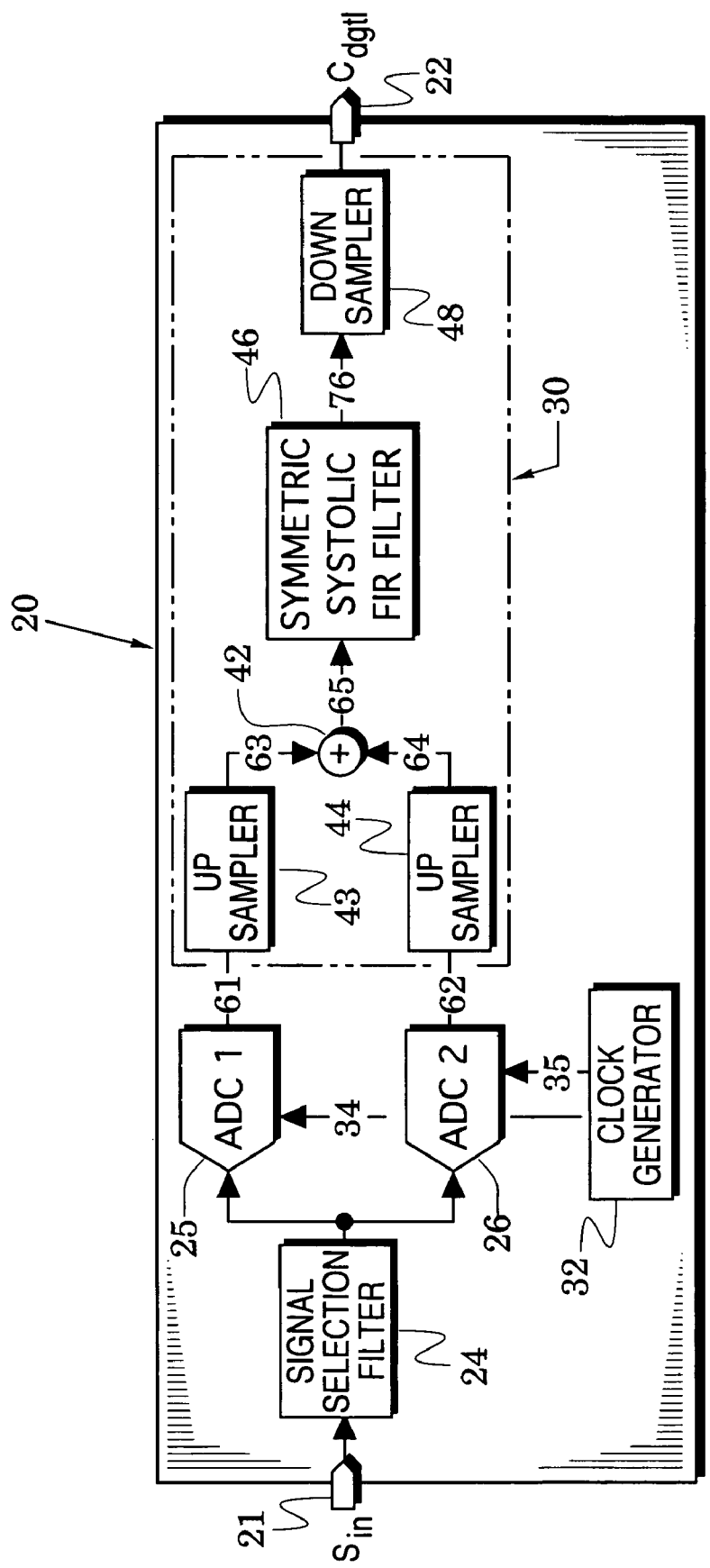
FIG. 1 is a diagram of a signal converter system embodiment of the present invention.

In particular, FIG. 1 illustrates a signal converter system 20 that converts an analog signal $S_{in}$ at a system input port 21 to a corresponding digital code $C_{dgtl}$ at a system output port 22. The system includes a signal selection filter 24, first and second analog-to-digital converters (ADCs) 25 and 26, a filter network 30 and a clock generator 32. The selection filter 24 is coupled to the input port, the filter network 30 is coupled to the output port 22, and the signal converters 25 and 26 are coupled between the selection filter 24 and first and second input ports of the filter network 30. The clock generator 32 provides first and second clock signals 34 and 35 that have a clock frequency $f_{clk}$ and are time interleaved (i.e., each clock pulse of clock signal 35 is equally spaced between adjacent clock pulses of clock signal 34).

Figure 3A:
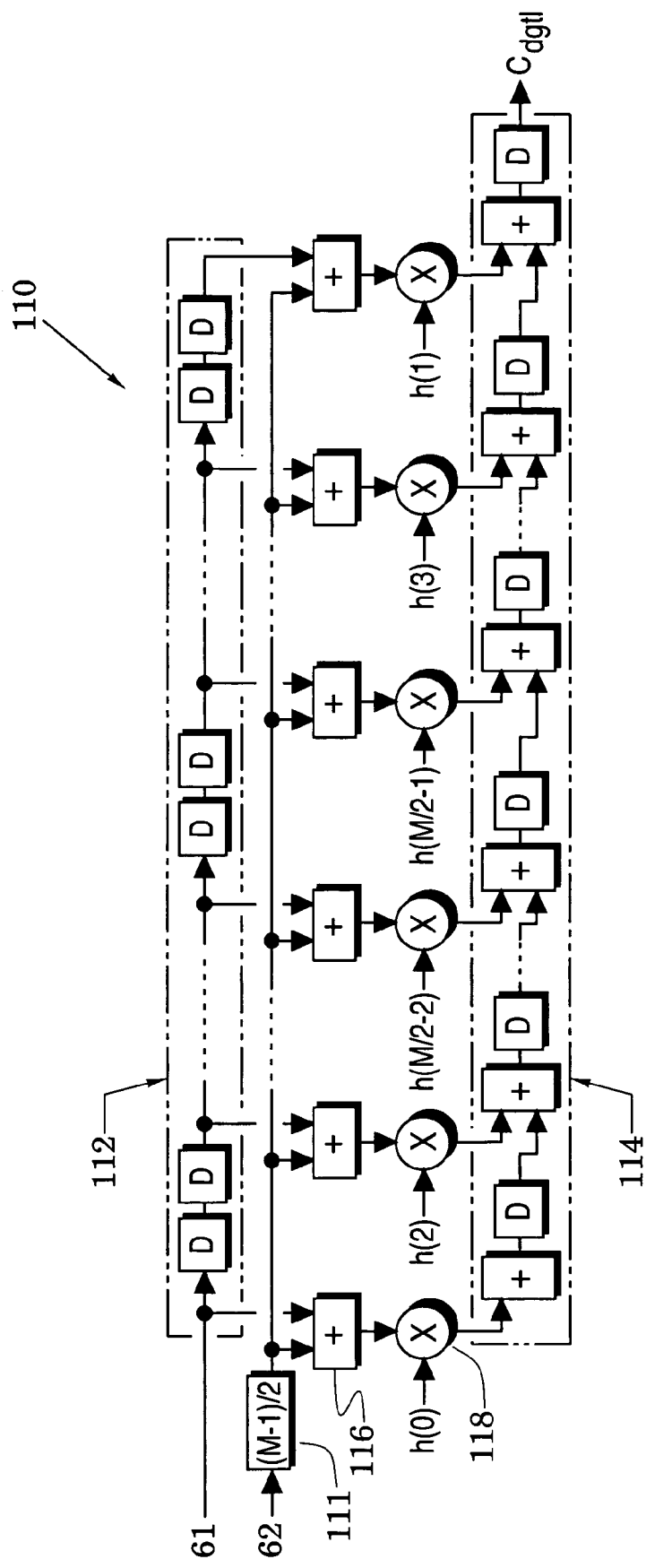
FIGS. 3A–3C are diagrams of embodiments of the filter network in the signal converter system of FIG. 1.
Figure 3B:
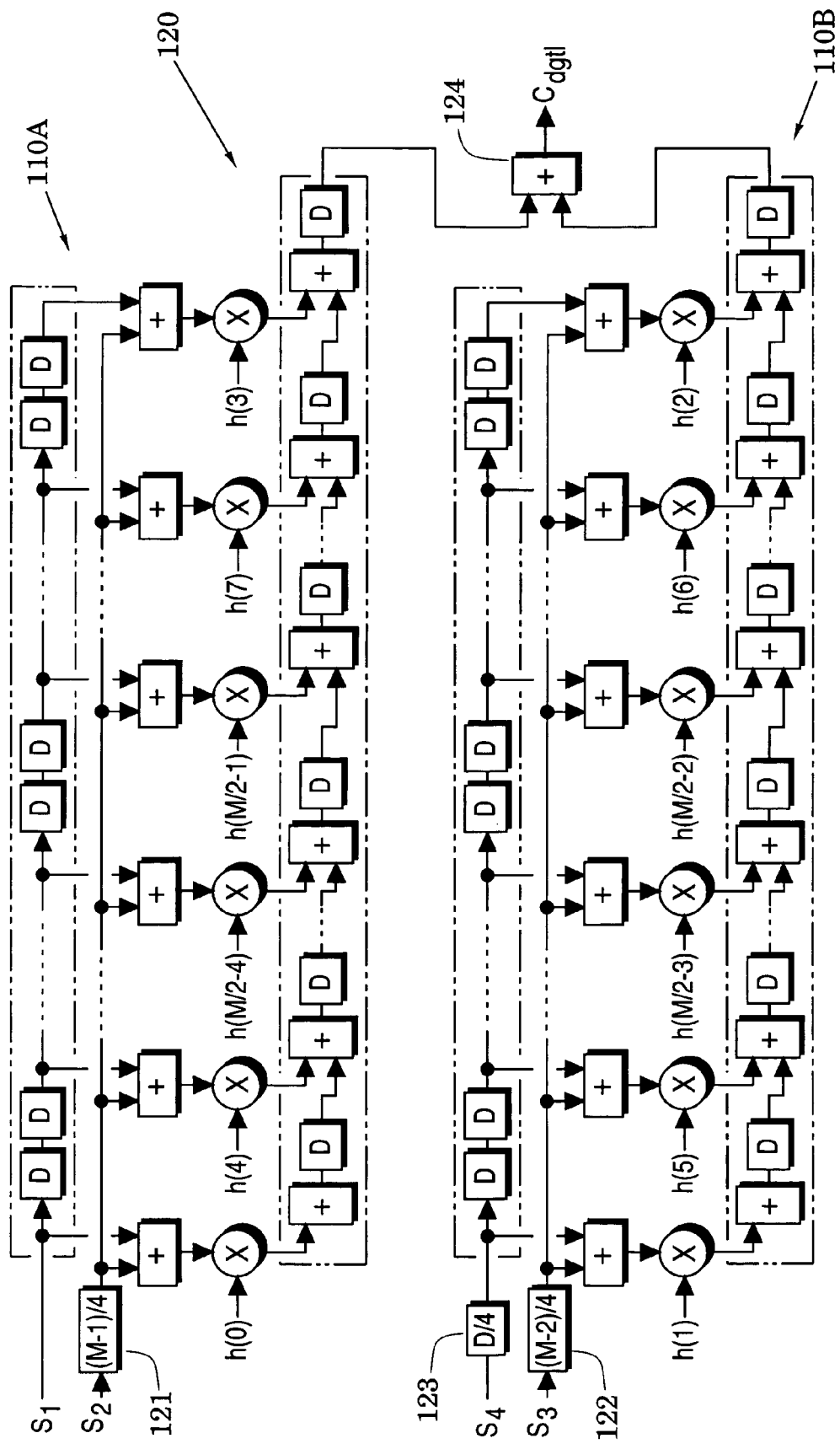
Figure 3C:
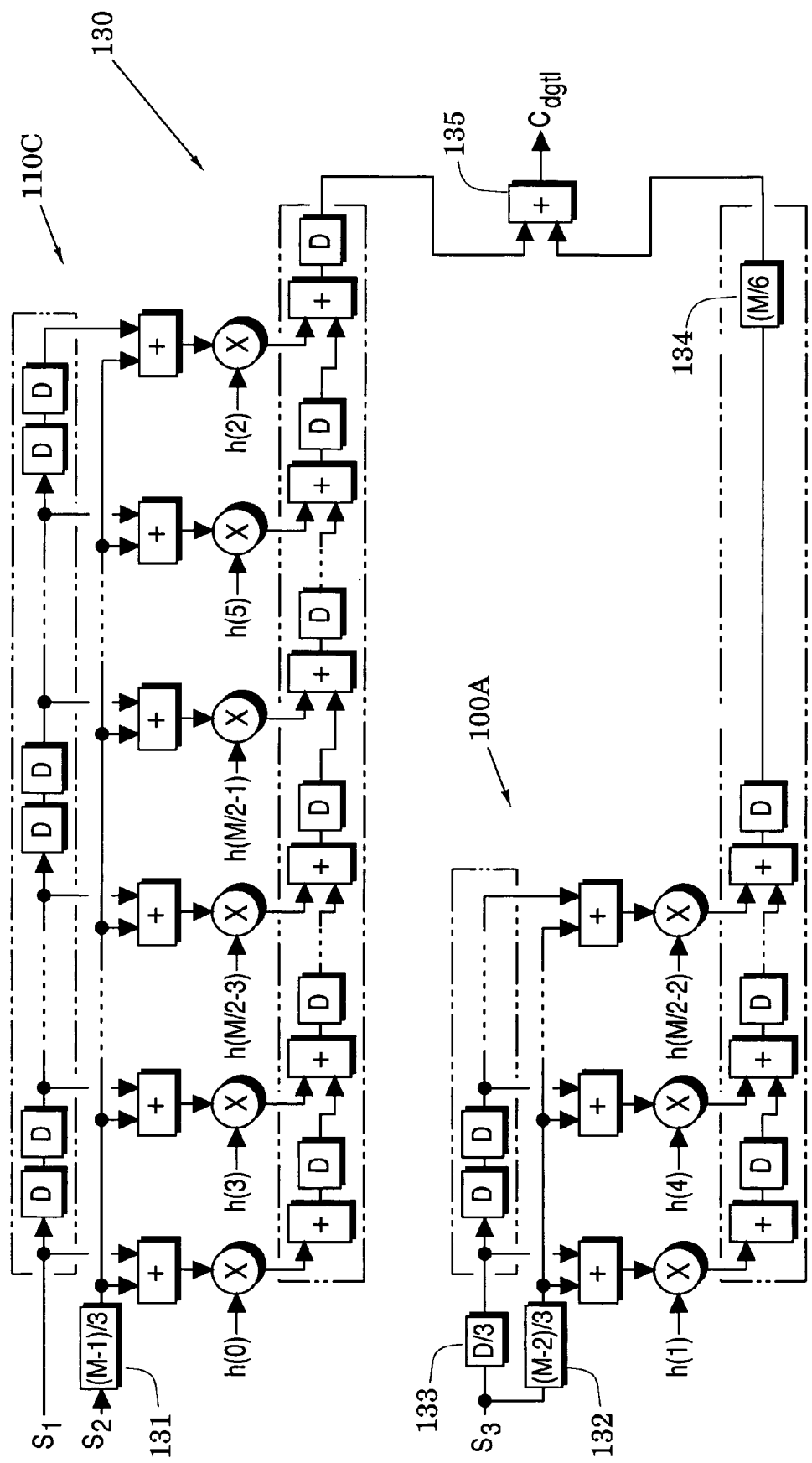

In the embodiment shown in FIG. 1, the filter network 30 includes a summer 42 and first and second upsamplers 43 and 44 respectively coupled between the first and second signal converters 25 and 26 and the summer 42. This embodiment further includes a digital filter 46 (e.g., a finite impulse response (FIR) filter) and a downsampler 48. The downsampler is coupled to the output port 22 and the FIR filter 46 is coupled between the summer 42 and the downsampler 48. Additional polyphase embodiments 30A, 30B and 30C of the filter network 30 are shown in FIGS. 3A–3C.

Before describing structure and operation of these embodiments, it is first noted that it is generally desirable to operate signal converters at the highest practicable sampling frequency in order to maximize the available bandwidth for input signals. For example, let it be assumed that a maximum clock frequency $f_{clk}$ for the signal converter 25 of FIG. 1 is 120 MHz as indicated by the frequency 51 in the frequency diagram 50 of FIG. 4A. Accordingly, the Nyquist frequency 52 of this converter is $f_{clk}/2$ (shown at 60 MHz) and input signals must be restricted to a selected one of the 60 MHz-wide Nyquist zones. The first three Nyquist zones are indicated in FIG. 4A by corresponding numbers positioned within circles.

Because signal converters assign digital codes to corresponding quantized regions of analog input signals, they produce a quantization noise that is related to the number of bits in the digital code. The present invention recognizes that the quantization noise can be spread over a wider region by oversampling. For example, if the analog input signals were restricted to the region below 30 MHz in FIG. 4A, the signal converter with its Nyquist frequency of 60 MHz would be oversampling by a factor of 2.

Accordingly, it would spread the quantization noise over twice the bandwidth of a signal converter which had a Nyquist frequency of 30 MHz. To gain this advantage, however, the available input bandwidth has been reduced by one half from the bandwidth which the converter is capable of processing. In a significant feature of the present invention, the signal converter system 20 of FIG. 1 is configured to gain the advantage of spreading the quantization noise and yet maintain the full Nyquist bandwidth of which each of its converters is capable.

To initiate an investigation of signal-to-noise ratio (SNR), let it be assumed that the signal converter 25 of FIG. 1 processes a 165 MHz analog input signal indicated by the frequency location 54 in FIG. 4A. Because this signal is in the converter's third Nyquist zone, it is aliased into the first Nyquist zone as a 45 MHz signal at the frequency location 55.

The first Nyquist zone and the 45 MHz signal are again shown in the frequency diagram 56 of FIG. 4B along with the noise 57 in this zone. In addition to the quantization noise, other components of this noise 57 generally include thermal noise and clock jitter noise. In an exemplary signal converter, the SNR in the first Nyquist zone has been found to be on the order of 67.6 dB.

Figure 5A:
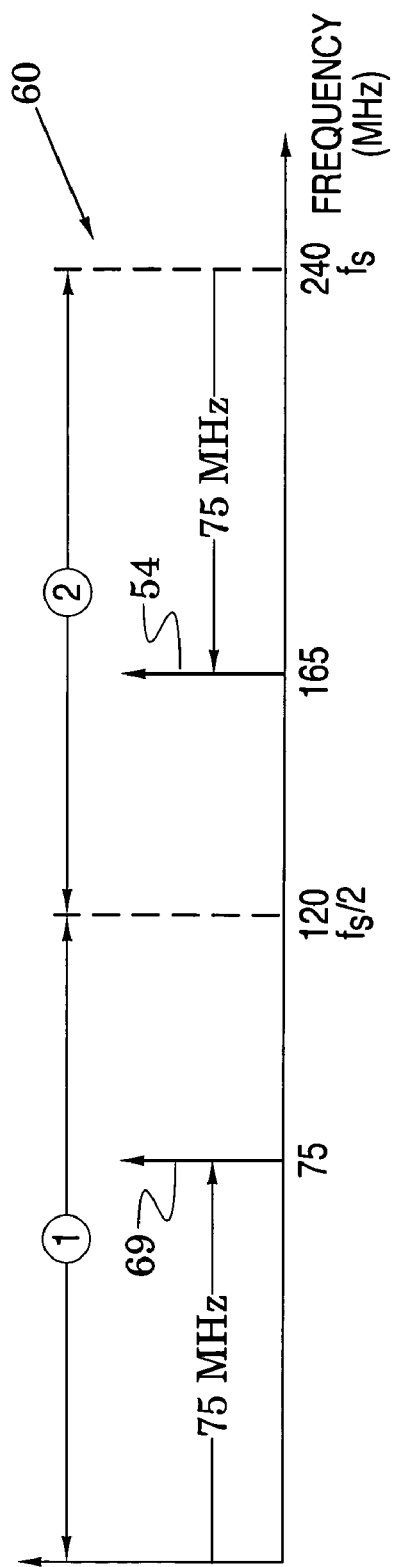
FIGS. 5A and 5B are frequency diagrams that illustrate exemplary initial operations of the system of FIG. 1.

In contrast, the frequency diagram 60 of FIG. 5A illustrates the Nyquist zones of interleaved converters in the signal converter system 20 of FIG. 1 and also illustrates the same analog input signal 54. In response to this input signal, the interleaved signal converters 25 and 26 of FIG. 1 generate digital sequences 61 and 62. The upsamplers 43 and 44 double the rate of these sequences (e.g., by inserting zeros) to obtain enhanced-rate sequences 63 and 64 that are summed in the summer 42 to provide a summed sequence 65. Because of the interleaved clock signals 34 and 35, the processed samples of the signal converter 25 are temporally interleaved with the processed samples of the signal converter 26 and the summed sequence 65 is that digital sequence that would had been produced by a single converter capable of being clocked at 240 MHz.

The signal converters 25 and 26, the clock generator 32, upsamplers 43 and 44 and summer 42 thus form an effective signal converter that has a sample frequency $f_s$ of 240 MHz and a Nyquist frequency of 120 MHz. This portion of the system 20 forms an interleaved subsystem which has corresponding first and second Nyquist zones that are indicated in FIG. 5A. It is apparent that the exemplary 165 MHz analog input signal at frequency location 54 (introduced in FIG. 4A) is now in the second Nyquist zone and is thus aliased into the first Nyquist zone as a 75 MHz signal at the frequency location 69.

Figure 5B:
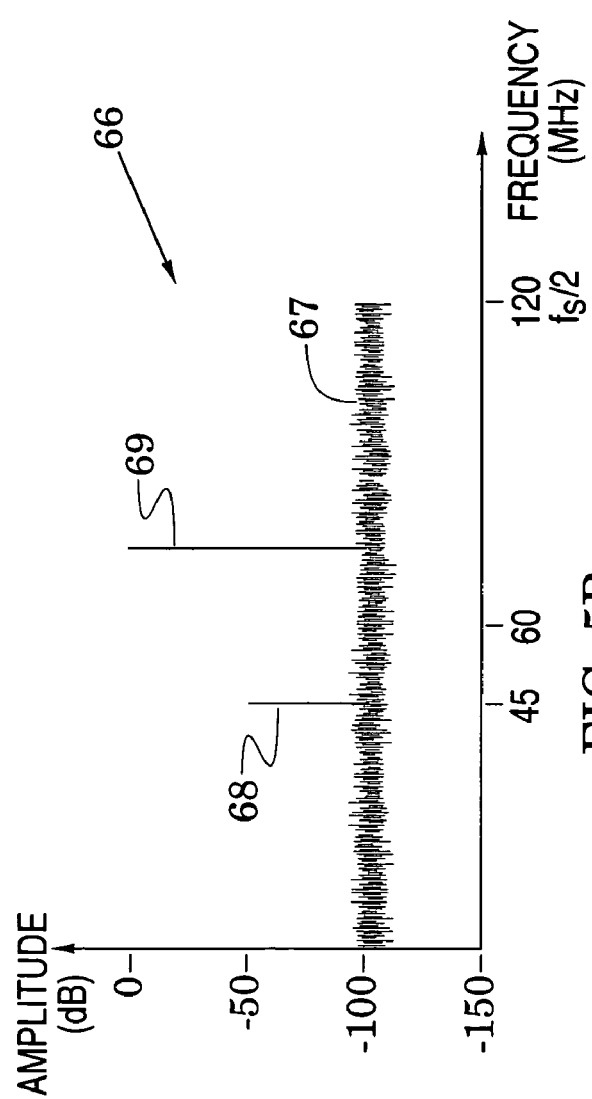

The first Nyquist zone and the 75 MHz signal are again shown in the frequency diagram 66 of FIG. 5B along with the noise 67 in this zone. In addition to harmonics of the input signal, the temporally interleaved signal converters 25 and 26 will typically also generate nonharmonic distortion products in the form of image spurs. This generation follows from the fact that the gain and phase of the signal converters can never be exactly matched. The image spur of interest occurs at the difference between the Nyquist frequency of 120 MHz and the aliased signal at 75 MHz. This image spur 68 is thus positioned at 45 MHz. Reasonable care in matching converter gains and phases can reduce the amplitude of this image spur to be at least 50 dB below that of the 75 MHz signal as shown in FIG. 5B.

It is important to note that the noise level in any frequency band (e.g., a 60 MHz band) of the noise 67 is substantially reduced from the noise in a similar frequency band of the noise 57 of FIG. 4B. This is a result of doubling the effective sequence rate as seen by comparison of Nyquist zones of FIGS. 4A and 5A. At this point, it is also important to note that the analog selection filter 24 in FIG. 1 is configured to selectively pass those analog signals which are to be converted to corresponding digital codes. Because it is presently assumed that the converter system 20 of FIG. 1 is processing a 165 MHz input signal (54 in FIG. 5A), the analog selection filter 24 should be configured to selectively pass this analog signal.

Preferably, the width of this selection filter's passband should not exceed one half of the clock frequency (frequency of clocks 34 and 35 in FIG. 1) and should be contained within a single one of Nyquist zones that are defined by the clock frequency. In addition to other advantages, this will enhance the reduction of image spurs which, as previously mentioned, are generated by gain and phase mismatches of the signal converters (25 and 26 in FIG. 1).

In FIG. 1, the summed sequence 65 is now processed through the digital filter 46 to become a filtered sequence 76 which is presented to the downsampler 48 for conversion into the digital code $C_{dgtl}$ that corresponds to the analog input signal $S_{in}$. In a filter embodiment, the digital filter 46 can be configured as an FIR filter with a selected number of filter taps (e.g., 96) to generate a selected filter passband 82 with a filter skirt 84 as shown in the frequency plot 80 of FIG. 6A.

It was noted above relative to FIG. 5A, that the interleaved converters (25 and 26 in FIG. 1) cause the 165 MHz input signal 54 to be aliased to a 75 MHz signal 69 in the first Nyquist zone of the interleaved converters. Accordingly, FIG. 6A shows that the filter passband 82 is positioned to pass the aliased 75 MHz signal 69, has a width limited to one half of the clock frequency (in FIG. 6A, the passband is somewhat less than 60 MHz), and is completely contained in the second Nyquist zone as defined by the clock frequency.

The summed sequence is thus processed by a digital filter (e.g., 46) into a filtered sequence (e.g., 76) which may, for example, be of the form $$y(n) = \sum_{i=0}^{M-1} h(i)x(n-i) \qquad (1)$$

in which h denotes filter coefficients and x denotes the summed sequence (e.g., 65 in FIG. 1). As previously noted, the width of the digital filter's passband is limited to one half of the clock frequency. The noise power in any selected frequency band of the filtered sequence will be reduced by N because of spreading of the quantization noise. Finally, the rate of the filtered sequence is reduced by N in a downsampler (e.g., 48). As stated above, N can be any number (e.g., 3 or 4) but it is two in the exemplary system shown in FIG. 1.

Directing attention now to the frequency diagram 86 of FIG. 6B, it is apparent that the filtered sequence (76 in FIG. 1) will contain the aliased signal 69 (introduced in FIG. 5B), the image spur 68 at a significantly-reduced level, and out-of-band noise 88 whose level is significantly reduced from that of the in-band noise 67. The reductions will be consistent with the filter skirts realized with the chosen filter configuration (e.g., consistent with the number of filter taps).

Because the system 20 of FIG. 1 initially spread the noise over twice the Nyquist band of any one of the signal converters 25 and 26, the power of the in-band noise 67 has been reduced by 3 dB. Thus the SNR in the upper half of the interleaved first Nyquist zone (the frequency region between 60 and 120 MHz) has been increased by 3 dB. If the selected passband were narrower, the increase in SNR in the frequency region between 60 and 120 MHz would be further enhanced. For example, if the passband were altered to 53 MHz, the increase in SNR would be 10 log(53/120) which is approximately 3.55 dB.

The rate of the filtered sequence (76 in FIG. 1) is now reduced by the downsampler (48 in FIG. 1) so that the Nyquist frequency for the converter system 20 of FIG. 1 is reduced to $f_{clk}/2$. Because the signal and noise shown in FIG. 6B are now positioned in the second Nyquist zone of the system 20 (i.e., in the region between one half of the clock frequency and the clock frequency), they are aliased into the system's first Nyquist zone as shown in FIG. 7. Accordingly, the 75 MHz signal 69 is aliased to an output signal 92 positioned at 45 MHz and the SNR in the first Nyquist zone continues to have the advantageous increase described above with reference to FIG. 6B. Although the image spur also lies at 45 MHz, the action of the digital filter (46 in FIG. 1) reduces it to an acceptably-low distortion level.

At this point, it is noted that the description above refers to a signal converter system that has two signal converters as shown in FIG. 1. In general, however, signal converter systems of the invention are configured with N signal converters that convert an analog input signal to N digital sequences (e.g., 61 and 62) in respective response to N interleaved clock signals (e.g., 34 and 35) that each have a common clock frequency $f_{clk}$. The filter network 30 of FIG. 1 is then configured to initially increase the rate of the digital sequences by N to provide N enhanced-rate sequences (e.g., 63 and 64) which are summed to produce a summed sequence (e.g., 65) having a sequence rate N times the clock frequency $f_{clk}$.

The summed sequence is filtered to provide a filtered sequence (e.g., 76). The filter passband is positioned in the first Nyquist zone of the interleaved system to pass the converted (and possibly aliased) signal. The width of the passband is limited to one half of the clock frequency $f_{clk}$ and is positioned to be completely contained in one Nyquist zone as defined by the clock frequency. Finally, the filtered sequence is downsampled by N so that the system's Nyquist frequency is $f_{clk}/2$.

More particularly, the filter passband is contained within a single one of Nyquist zones whose widths are one half of the clock frequency and is positioned to pass information contained in the analog signal. In some system embodiments, the digital sequences (e.g., 61 and 62 in FIG. 1) provide a digital representation (e.g., 54 in FIG. 5A) of the analog signal and the filter passband is positioned to pass the digital representation. In other system embodiments, the digital sequences (e.g., 61 and 62 in FIG. 1) provide a digital representation and an aliased digital representation (e.g., 69 in FIG. 5A) of the analog signal and the filter passband is positioned to pass the aliased digital representation.

Figure 2:
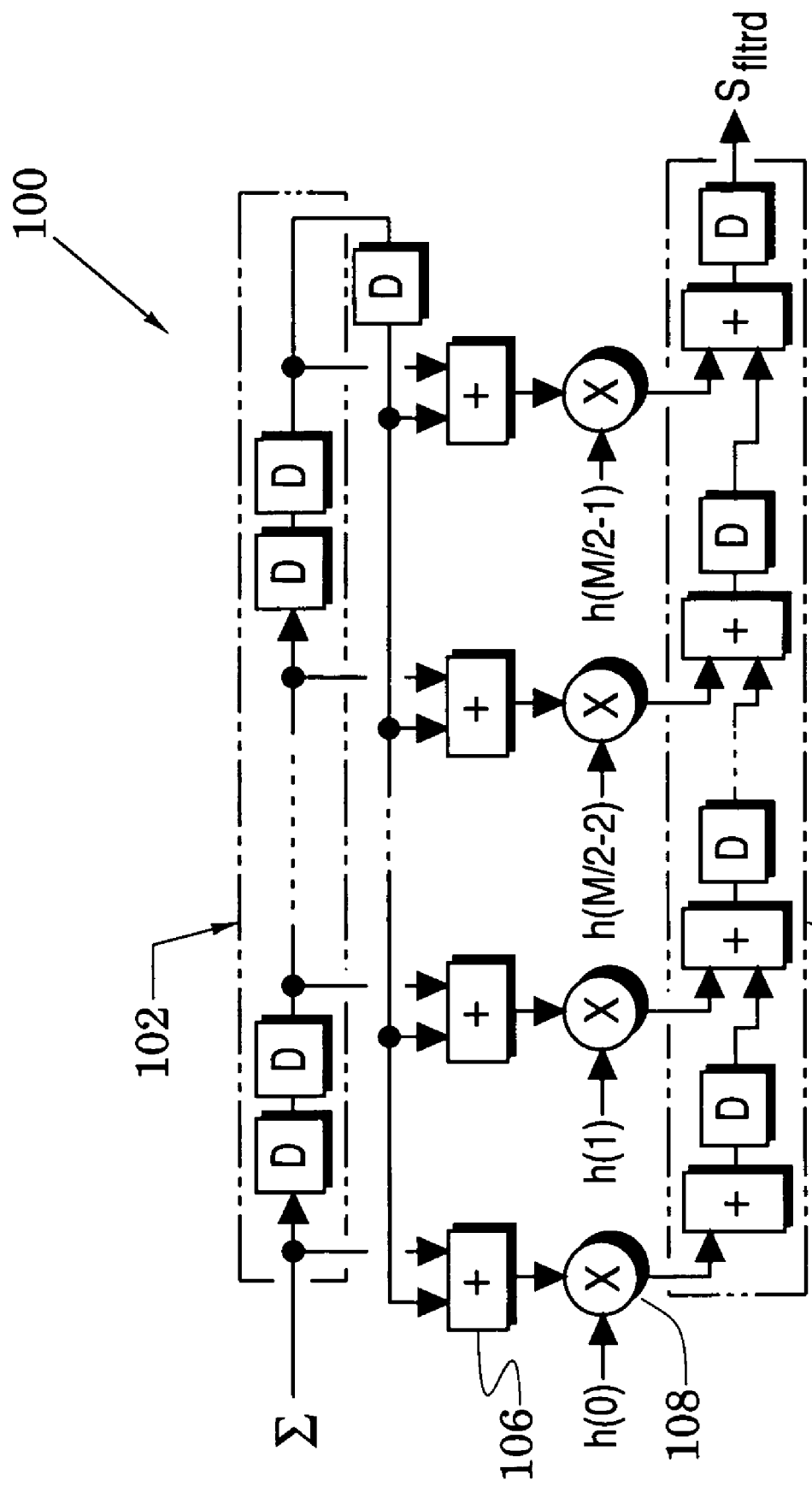
FIG. 2 is a diagram of a digital filter embodiment for use in a filter network in the signal converter system of FIG. 1.

In the converter system embodiment described above, the filter 46 was structured as a finite impulse response filter. An embodiment 100 of this filter is shown in FIG. 2 to include a data buffer 102 which receives the summed sequence 65 (introduced in FIG. 1), an accumulator buffer 104 that provides the filtered sequence $S_{fltrd}$ (76 in FIG. 1), and summers 106 and multipliers 108 arranged therebetween. The buffers can be formed with digital registers which introduce delays. For example, a delay of one sequence period is indicated by the letter D wherein the sequence periods are the period of the summed sequence (65 in FIG. 1), i.e., the period of a frequency $Nf_{clk}$ wherein N is two for the system 20 of FIG. 1.

The structure of the filter 100 has been transposed to facilitate the simple accumulator buffer 104 which successively sums products from the summers 106 and multipliers 108 to thereby generate the filtered sequence $S_{fltrd}$. In addition, the filter has been arranged to have a systolic structure in which filter coefficients are reversed in order to permit sequence data to be clocked down the data buffer 102 rather than being clocked simultaneously to all of the summers and multipliers. This systolic structure is generally simpler to realize as it comprises repeated structural blocks.

Finally, the filter has been arranged to have a symmetrical structure to take advantage of the fact that the filter coefficients will generally be symmetrical so that the second half of these coefficients is the mirror image of the first half of coefficients. Thus, the filter coefficients begin with h(0) and terminate with h(M/2−1) wherein M is the number of filter taps. The symmetry is completed by wrapping the output of the data buffer 102 around to be the second input to each of the summers 106.

FIG. 1 shows that one embodiment of the filter network 30 comprises upsamplers, a summer, a digital filter and a downsampler. FIG. 3A illustrates another embodiment of the filter network 30 in the form of a symmetric systolic finite impulse response filter 110 which has been arranged to define two input ports for reception of the digital sequences 61 and 62 (introduced in FIG. 1).

This filter network 110 includes a delay 111 which is introduced in one of the sequences to temporally align elements of the sequences 61 and 62 and to temporally offset the sequence 62. The ½ portion of the delay 111 temporally aligns elements of the sequences 61 with elements of the sequence 62 for further processing and the M/2 portion performs the offset. The sequence 62 is thus initially temporally aligned and then temporally converted to an offset sequence. The offset corresponds to one half of the number of filter coefficients (i.e., filter taps). It is noted that the delays D shown throughout the filter network 110 are delays of one sequence period wherein these sequence periods are that of the clock frequency $f_{clk}$.

The filter network 110 also includes a data buffer 112, an accumulator buffer 114, and summers 116 and multipliers 118 arranged between these buffers. The data buffer 112 converts the sequence 61 into a successively-delayed sequences. The summers 116 and multipliers 118 are arranged to receive the offset sequence and the successively-delayed sequences and, in response, form products of filter coefficients and sums of elements of the offset and successively-delayed sequences.

The accumulator buffer 114 then successively sums the products generated by the summers 116 and multipliers 118. Delays are introduced into the accumulator buffer to synchronize its summing action with the availability of the products to be summed. It is apparent that the summers and multipliers can be organized in other arrangement embodiments and still provide the desired products of coefficients and sequence elements.

In important features of this filter network embodiment, its structure is arranged to form a symmetric systolic finite impulse response filter that defines N input ports for reception of the digital sequences. In addition, one of the digital sequences is offset by one half of the number of filter coefficients and the filter coefficients are arranged to alternately proceed inward from entrance and exit ends of the filter. That is, h(0) is at the entrance end, h(1) is at the exit end, h(2) is positioned inward from h(0), h(3) is positioned inward from h(1) and so on.

To appreciate another important feature of the filter network embodiment 110, it is first noted that the filter 100 of FIG. 2 initially forms products of filter coefficients and summed elements of the summed sequence 65 of FIG. 1. These products are then successively summed in the accumulator buffer 104 to form the filtered sequence 76 of FIG. 1. However, the downsampler 48 of FIG. 1 then throws away one half of the filtered sequence. This inefficiency is removed when the filter network 30 of FIG. 1 is replaced by the filter network embodiment 110 of FIG. 3A because this network only generates those products which are necessary to form the digital code (i.e., the digital code $C_{dgtl}$ at the system output port 22 of FIG. 1). Accordingly, system efficiency is substantially enhanced.

Although the filter network 110 of FIG. 3A has been structured for a converter system in which N is two, similar symmetric systolic finite impulse response filters can be provided for other numbers of signal converters. For example, FIG. 3B illustrates a filter network embodiment 120 that is structured for a converter system in which the number of signal converters is four. The filter network 120 comprises first and second filter sections 110A and 110B which are given these reference numbers because they are each substantially the filter structure shown in FIG. 3A.

If the clock signals are interleaved so that the four signal converters provide temporally-staggered sequences $S_1$–$S_4$, then sequences $S_1$ and $S_2$ are processed by the first filter section and sequences $S_3$ and $S_4$ are processed by the second filter section. The second and third filter sequences are provided with delays 121 and 122 which offset them by M/4. In addition, the delays include delays of ¼ and ¾ which temporally aligns sequence elements for processing.

A delay 123 of D/4 is also inserted to temporally delay the sequence $S_4$ relative to the sequence $S_1$. A final summer 124 sums outputs of the first and second filter sections to form the digital code $C_{dgtl}$. The final delays in the upper and lower accumulator buffers may be adjusted to enhance sequence alignment prior to the summer 124.

The filter coefficients are arranged similar to their arrangements in the filter network 110 except that they also alternate between the filter sections. That is, h(0) is at the entrance end of section 110A, h(1) is at the entrance end of section 110B, h(2) is at the exit end of section 110B, h(3) is at the exit end of section 110A and so on.

For another embodiment, FIG. 3C illustrates a filter network 130 that is structured for a converter system in which the number of signal converters is three. The filter network 130 comprises a first filter section 110C which is essentially the filter 110 of FIG. 3A and also comprises a second filter section 100A which is essentially the filter 100 of FIG. 2. Delays 131 and 132 are inserted to realize the necessary sequence offsets and alignment. In addition, a delay 133 of D/3 is inserted to delay the sequence $S_3$ prior to entry into its respective data buffer and a delay 134 is inserted in the respective accumulator buffer to enhance sequence alignment prior to a final summer 135. The filter coefficients are arranged similar to their arrangements in the filter network 120 except that the second filter section 100A only has an entrance end.

In another feature of the present invention, the structure of the signal converter systems automatically reduces signifi-
cant harmonics of the output signals (e.g., the second and third harmonics) for selected frequency bands of input signals. For example, when the filter passband of FIG. 6A is used in the signal converter system of FIG. 1, the second and third signal harmonics are positioned outside of the filter passband for all analog input signals in the range between 138.4 MHz and 152.5 MHz. Accordingly, the presence of the second and third signal harmonics is substantially reduced in the digital code at the output port 22 in FIG. 1.

For a second example, when the structure of a four signal converter system is realized with the filter arrangement of FIG. 6A, the second and third signal harmonics will be positioned outside of the selected filter passband for all analog input signals in the range between 125 MHz and 152.5 MHz.

The filter networks shown in FIGS. 1, 2 and 3A–3C can be realized with various conventional electronic structures. Although one such structure is an appropriately-programmed digital processor, it may be desirable in some applications to employ a faster embodiment such as an appropriately-configured array of digital gates (e.g., a field programmable gate array (FPGA)). Another structure may be a combination of an array of gates and an appropriately-programmed processor.

An understanding of system and method embodiments of the present invention may be enhanced by considering again an embodiment having two converters (e.g., as shown in FIG. 1) and noting that in 2X interleaved processing of an analog input signal (i.e., two converters receiving the analog input signal but responding to separate clocks which are 180 degrees out of phase), the Nyquist zone is doubled compared to processing with a single converter or processing with two averaged converters that respond to the same clock.

For example, two 100 Msps (megasamples per second) interleaved converters are equivalent to a 200 Msps converter and will provide a 100 MHz Nyquist bandwidth for the interleaved system. If the noise in the 1st half of the 1st Nyquist zone (of the interleaved system) is termed Vnoise1st and the noise in the 2nd half of the 1st Nyquist zone (of the interleaved system) is referred to as Vnoise2nd, then, $$V\text{noisetotal} = \sqrt{V\text{noise1st}^2 + V\text{noise2nd}^2}. \qquad (2)$$

Assuming that Vnoise1st=Vnoise2nd, equation (2) becomes, $$V\text{noisetotal} = \sqrt{V\text{noise1st}^2 + V\text{noise1st}^2} = \sqrt{2} V\text{noise1st}. \qquad (3)$$

If a filter network of the invention (e.g., the filter network 110 of FIG. 3A) is applied to filter out the noise in the second half of the $1^{st}$ Nyquist zone, then, $$V\text{noisetotalfiltered} = V\text{noise1st}. \qquad (4)$$

Substituting equation (4) into equation (3) yields $$V\text{noisetotal} = \sqrt{2} V\text{noisetotalfiltered} \qquad (5)$$

which shows that 2X converter systems of the invention provide a process gain of 3 dB. For the more general case of NX converter systems, equation (5) becomes $$V\text{noisetotal} = \sqrt{N} V\text{noisetotalfiltered} \qquad (6)$$

which indicates a process gain in dB of $20 \log \sqrt{N}$.

Although converter system embodiments of the invention can be used in a variety of applications, they are especially advantageous in applications in which jitter noise is more prominent than other noise types (e.g., thermal and quantization noise). In these applications, system embodiments of the invention will provide the process gain described above whereas some other multiple-converter configurations (e.g., averaging configurations) fail to do so.

It has been found, for example, that two advanced converters used in a 100 Msp, 45 MHz bandwidth converter system embodiment can provide an SNR on the order of 83 dBFS (dB full scale) with a 70 MHz input signal and an SNR on the order of 80 dBFS (dB full scale) with a 140 MHz input signal.

An understanding of the filter networks of FIGS. 3A–3C may be further enhanced by considering the filter network diagrams of FIG. 8. Diagram 140 schematically shows the filter 46 and downsampler 48 of FIG. 1 wherein the sequence x(n) is the summed sequence 65 of FIG. 1. The transfer function of the filter 46 can be expressed as, $$H(z) = \sum_{n=0}^{M-1} h(n)z^{-n} = \sum_{n=0}^{(M-1)} h(2n)z^{-2n} + \sum_{n=0}^{(M-1)/2} h(2n+1)z^{-(2n+1)}$$

$$= \sum_{n=0}^{(M-1)/2} h(2n)z^{-2n} + z^{-1} \sum_{n=0}^{(M-1)/2} h(2n+1)z^{-2n}$$

$$= H_0(z^2) + z^{-1} H_1(z^2)$$

wherein $$H_0(z^2) = \sum_{n=0}^{(M-1)/2} h(2n)z^{-2n} \text{ and } H_1(z^2) = \sum_{n=0}^{(M-1)/2} h(2n+1)z^{-2n}.$$

The last two lines of these equations represent polyphase filters and are schematically shown in the diagram 141 of FIG. 8 which shows the polyphase filters in a parallel arrangement.

In diagram 142, the downsampler is translated to equivalent positions ahead of the summation point and, in diagram 143, it is further translated to equivalent positions ahead of each filter block. Accordingly, the process rate of each polyphase filter in diagram 143 reduces from 2n to n. After noting that the processes accomplished by the delay block and the downsamplers of diagram 143 can be performed by a commutation switch, they are replaced by such a switch in diagram 144.

Recalling that the sequence x(n) is the summed sequence 65 of FIG. 1 and noting the action of the commutation switch in diagram 144, it is apparent that they can all be replaced by the digital sequences 61 and 62 of FIG. 1 as is done in diagram 145. Finally, it is noted that diagram 145 has been realized in FIG. 3A with the filter network 110.

The filter network 110 can also be developed with a more rigorous mathematical approach. Consider again the digital filter 46 of FIG. 1 that is defined by coefficients h(n). With the summed sequence 65 of FIG. 1 expressed as an input x(n) and the filtered sequence 76 expressed as an output y(n), it follows that $$y(n) = \sum_{i=0}^{\frac{M}{2}-1} h(i)[x(n-1) + x(n-M+1+i)].$$

Because x(n) is the interleaved output of the converters 25 and 26, it is apparent that the sequence x(n) can be expressed as a(0), b(0), a(1), b(1), a(2), b(2), . . . so that the output can be described by interleaving $y_0(n)$ and $y_1(n)$ wherein $$y_0(n) = h(0)a(n) + h(1)b(n-1) + h(2)a(n-1) + h(3)b(n-2) + \ldots +$$
$$h\left(\frac{M}{2}-2\right)a\left(n-\frac{M}{4}+1\right) + h\left(\frac{M}{2}-1\right)b\left(n-\frac{M}{4}\right) + h\left(\frac{M}{2}-1\right)a\left(n-\frac{M}{4}\right) +$$
$$h\left(\frac{M}{2}-2\right)b\left(n-\frac{M}{4}-1\right) + \ldots + h(3)a\left(n-\frac{M}{2}+2\right) +$$
$$h(2)b\left(n-\frac{M}{2}+1\right) + h(1)a\left(n-\frac{M}{2}+1\right) + h(0)b\left(n-\frac{M}{2}\right) \text{ and }$$

$$y_1(n) = h(0)b(n) + h(1)a(n) + h(2)b(n-1) + h(3)a(n-1) +$$
$$\ldots + h\left(\frac{M}{2}-2\right)b\left(n-\frac{M}{4}+1\right) + h\left(\frac{M}{2}-1\right)a\left(n-\frac{M}{4}+1\right) +$$
$$h\left(\frac{M}{2}-1\right)b\left(n-\frac{M}{4}\right) + h\left(\frac{M}{2}-2\right)a\left(n-\frac{M}{4}\right) + \ldots + h(3)b\left(n-\frac{M}{2}+2\right) +$$
$$h(2)a\left(n-\frac{M}{2}+2\right) + h(1)b\left(n-\frac{M}{2}+1\right) + h(0)a\left(n-\frac{M}{2}+1\right).$$

After the decimation process of the downsampler 48 of FIG. 1, only $y_0(n)$ remains. Regrouping the terms leads to $$y(n) = h(0)\left[a(n) + b\left(n-\frac{M}{2}\right)\right] + h(2)\left[a(n-1) + b\left(n-\frac{M}{2}+1\right)\right] +$$
$$\ldots + h\left(\frac{M}{2}-2\right)\left[a\left(n-\frac{M}{4}+1\right) + b\left(n-\frac{M}{4}-1\right)\right] +$$
$$h\left(\frac{M}{2}-1\right)\left[a\left(n-\frac{M}{4}\right) + b\left(n-\frac{M}{4}\right)\right] + \ldots +$$
$$h(3)\left[a\left(n-\frac{M}{2}+2\right) + b(n-2)\right] + h(1)\left[a\left(n-\frac{M}{2}+1\right) + b(n-1)\right].$$

It is noted, however, that this final equation also mathematically corresponds to the processes of the filter network 110 of FIG. 3A.

Applying the same approach to realize the filter network 120 of FIG. 3B, it is apparent, in a four converter system, that the sequence x(n) can be expressed as a(0), b(0), c(0), d(0), a(1), b(1), c(1), d(1), a(2), b(2), . . . , so that the output can be described by interleaving $y_0(n)$, $y_1(n)$, $y_2(n)$, and $y_3(n)$. After decimation by four, only $y_0(n)$ remains which leaves $$y(n) = h(0)a(n) + h(1)d(n-1) + h(2)c(n-1) + h(3)b(n-1) +$$
$$h(4)a(n-1) + h(5)d(n-2) + h(6)c(n-2) + h(7)b(n-2) +$$
$$\ldots + h\left(\frac{M}{2}-4\right)a\left(n-\frac{M}{8}+1\right) + h\left(\frac{M}{2}-3\right)d\left(n-\frac{M}{8}\right) +$$
$$h\left(\frac{M}{2}-2\right)c\left(n-\frac{M}{8}\right) + h\left(\frac{M}{2}-1\right)b\left(n-\frac{M}{8}\right) + h\left(\frac{M}{2}-1\right)a\left(n-\frac{M}{8}\right) +$$
$$h\left(\frac{M}{2}-2\right)d\left(n-\frac{M}{8}-1\right) + h\left(\frac{M}{2}-3\right)c\left(n-\frac{M}{8}-1\right) +$$
$$h\left(\frac{M}{2}-4\right)b\left(n-\frac{M}{8}-1\right) + \ldots + h(7)a\left(n-\frac{M}{4}+2\right) +$$
$$h(6)d\left(n-\frac{M}{4}+1\right) + h(5)c\left(n-\frac{M}{4}+1\right) + h(4)b\left(n-\frac{M}{4}+1\right) +$$
$$h(3)a\left(n-\frac{M}{4}+1\right) + h(2)d\left(n-\frac{M}{4}\right) + h(1)c\left(n-\frac{M}{4}\right) + h(0)b\left(n-\frac{M}{4}\right).$$

Grouping terms provides $$y(n) = h(0)\left[a(n) + b\left(n - \frac{M}{4}\right)\right] + h(4)\left[a(n-1) + b\left(n - \frac{M}{4} + 1\right)\right] +$$
$$\ldots + h\left(\frac{M}{2} - 4\right)\left[a\left(n - \frac{M}{8} + 1\right) + b\left(n - \frac{M}{8} - 1\right)\right] +$$
$$h\left(\frac{M}{2} - 1\right)\left[a\left(n - \frac{M}{8}\right) + b\left(n - \frac{M}{8}\right)\right] + \ldots +$$
$$h(7)\left[a\left(n - \frac{M}{4} + 2\right) + b(n-2)\right] + h(3)\left[a\left(n - \frac{M}{4} + 1\right) + b(n-1)\right] +$$
$$h(1)\left[d(n-1) + c\left(n - \frac{M}{4}\right)\right] + h(5)\left[d(n-2) + c\left(n - \frac{M}{4} + 1\right)\right] +$$
$$\ldots + h\left(\frac{M}{2} - 3\right)\left[d\left(n - \frac{M}{8}\right) + c\left(n - \frac{M}{8} - 1\right)\right] +$$
$$h\left(\frac{M}{2} - 2\right)\left[d\left(n - \frac{M}{8} - 1\right) + c\left(n - \frac{M}{8}\right)\right] + \ldots +$$
$$h(6)\left[d\left(n - \frac{M}{4} + 1\right) + c(n-2)\right] + h(2)\left[d\left(n - \frac{M}{4}\right) + c(n-1)\right].$$

It is noted, however, that this final equation also mathematically corresponds to the filter network 120 of FIG. 3B.

Applying the approach again to realize the filter network 130 of FIG. 3C, it is apparent, in a three converter system, that the sequence x(n) can be expressed as a(0), b(0), c(0), a(1), b(1), c(1), a(2), b(2), . . . so that the output can be described by interleaving $y_0(n)$, $y_1(n)$, and $y_2(n)$. After decimation by three, only $y_0(n)$ remains which leaves $$y(n) = h(0)a(n) + h(1)c(n-1) + h(2)b(n-1) + h(3)a(n-1) +$$
$$h(4)c(n-2) + h(5)b(n-2) + \ldots + h\left(\frac{M}{2} - 3\right)a\left(n - \frac{M}{6} + 1\right) +$$
$$h\left(\frac{M}{2} - 2\right)c\left(n - \frac{M}{6}\right) + h\left(\frac{M}{2} - 1\right)b\left(n - \frac{M}{6}\right) + h\left(\frac{M}{2} - 1\right)a\left(n - \frac{M}{6}\right) +$$
$$h\left(\frac{M}{2} - 2\right)c\left(n - \frac{M}{6} - 1\right) + h\left(\frac{M}{2} - 3\right)b\left(n - \frac{M}{6} - 1\right) + \ldots +$$
$$h(5)a\left(n - \frac{M}{3} + 2\right) + h(4)c\left(n - \frac{M}{3} + 1\right) + h(3)b\left(n - \frac{M}{3} + 1\right) +$$
$$h(2)a\left(n - \frac{M}{3} + 1\right) + h(2)a\left(n - \frac{M}{3} + 1\right) + h(1)c\left(n - \frac{M}{3}\right) + h(0)b\left(n - \frac{M}{3}\right).$$

Grouping terms provides, $$y(n) = h(0)\left[a(n) + b\left(n - \frac{M}{3}\right)\right] + h(3)\left[a(n-1) + b\left(n - \frac{M}{3} + 1\right)\right] + \ldots +$$
$$h\left(\frac{M}{2} - 3\right)\left[a\left(n - \frac{M}{6} + 1\right) + b\left(n - \frac{M}{6} - 1\right)\right] + h\left(\frac{M}{2} - 1\right)\left[a\left(n - \frac{M}{6}\right)\right] +$$
$$\ldots + h(5)\left[a\left(n - \frac{M}{3} + 2\right) + b(n-2)\right] + H(2)\left[a\left(n - \frac{M}{3} + 1\right) + b(n-1)\right] +$$
$$h(1)\left[c(n-1) + c\left(n - \frac{M}{3}\right)\right] + h(4)\left[c(n-2) + c\left(n - \frac{M}{3} + 1\right)\right] +$$
$$\ldots + h\left(\frac{M}{2} - 2\right)\left[c\left(n - \frac{M}{6}\right) + c\left(n - \frac{M}{6} - 1\right)\right].$$

Finally, it is noted that this final equation also mathematically corresponds to the filter network 130 of FIG. 3C.

The embodiments of the invention described herein are exemplary and numerous modifications, variations and rearrangements can be readily envisioned to achieve substantially equivalent results, all of which are intended to be embraced within the spirit and scope of the invention as defined in the appended claims

We claim:

1. A signal converter system that converts an analog signal to a corresponding digital code, the system comprising:
    N analog-to-digital converters arranged to convert said analog signal to N digital sequences in respective response to N interleaved clock signals that have a common clock frequency; and
    a filter network that processes said digital sequences into said digital code with a filter passband that is contained within a single one of Nyquist zones whose widths are one half of said clock frequency and that is positioned to pass information contained in said analog signal;
    wherein said digital sequences provide a digital representation and an aliased digital representation of said analog signal and said filter passband is positioned to pass said aliased digital representation.

2. The system of claim 1, wherein said filter network is configured to:
    increase the rate of said digital sequences by N to provide enhanced-rate sequences;
    process a sum of said enhanced-rate sequences through a digital filter having said filter passband to thereby provide a filtered sequence; and
    reduce the rate of said filtered sequence by N to thereby realize said digital code.

3. The system of claim 1, wherein said filter network includes:
    N upsamplers that each process a respective one of said digital sequences into a respective one of enhanced-rate sequences;
    a digital filter having said selected filter passband and arranged to process a sum of said enhanced-rate sequences into a filtered sequence; and
    a downsampler that reduces the rate of said filtered sequence by N to thereby realize said digital code.

4. The system of claim 3, wherein said digital filter is a finite impulse response filter.

5. A signal converter system that converts an analog signal to a corresponding digital code, the system comprising:
    N analog-to-digital converters arranged to convert said analog signal to N digital sequences in respective response to N interleaved clock signals that have a common clock frequency; and
    a filter network that processes said digital sequences into said digital code with a filter passband that is contained within a single one of Nyquist zones whose widths are one half of said clock frequency and that is positioned to pass information contained in said analog signal;
    wherein said filter network comprises a symmetric systolic finite impulse response filter arranged to define N input ports for reception of said digital sequences.

6. The system of claim 5, wherein said filter network includes:
    at least one data buffer arranged to convert a corresponding one of said digital sequences into a successively-delayed sequence;
    at least one delay element arranged to convert a corresponding one of said digital sequences into a temporally offset sequence;
    summers and multipliers arranged to provide products of filter coefficients and sums of said successively-delayed and offset sequences; and
    at least one accumulator buffer that successively sums said products to provide said digital code.

7. The system of claim 5, further including a clock generator that provides said interleaved clock signals.

8. The system of claim 5, wherein said digital sequences provide a digital representation of said analog signal and said filter passband is positioned to pass said digital representation.

9. The system of claim 5, wherein N is a selected one of two, three and four.

10. The system of claim 5, wherein said filter network is realized with an array of digital gates.

11. The system of claim 5, further including an analog filter inserted before said converters and having a selection passband positioned to pass said analog signal.

12. A signal converter system that converts an analog signal to a corresponding digital code, the system comprising:
N analog-to-digital converters arranged to convert said analog signal to N digital sequences in respective response to N interleaved clock signals that have a common clock frequency; and
a filter network that processes said digital sequences into said digital code with a filter passband that is contained within a single one of Nyquist zones whose widths are one half of said clock frequency and that is positioned to pass information contained in said analog signal;
wherein said filter includes:
a data buffer configured to:
a) convert at least one of said digital sequences into a temporally offset digital sequence; and
b) successively delay at least one of said digital sequences into successively-delayed digital sequences;
summers and multipliers arranged to provide products of filter coefficients and sums of elements of said offset digital sequence and said successively-delayed digital sequences; and
an accumulator that provides said digital code in successive response to said products.

13. The system of claim 12, wherein said data buffer is further configured to temporally align elements of said offset digital sequence and said successively-delayed digital sequence.

14. A signal converter system that converts an analog signal to a corresponding digital code, the system comprising:
N analog-to-digital converters arranged to convert said analog signal to N digital sequences in respective response to N interleaved clock signals that have a common clock frequency; and
a filter network that processes said digital sequences into said digital code with a filter passband that is contained within a single one of Nyquist zones whose widths are one half of said clock frequency and that is positioned to pass information contained in said analog signal;
wherein said filter network is realized with an appropriately-programmed processor.

15. A method for converting an analog signal to a corresponding digital code, comprising the steps of:
converting said analog signal to N digital sequences in respective response to N interleaved clock signals that each have a common clock frequency; and
processing said digital sequences into said digital code with a filter passband that is contained within a single one of Nyquist zones whose widths are one half of said clock frequency and that is positioned to pass information contained in said analog signal;
wherein said digital sequences provide a digital representation and an aliased digital representation of said analog signal and said processing step includes the step of positioning said filter passband to pass said aliased digital representation.

16. The method of claim 15, wherein said processing step includes the steps of:
increasing the rate of said digital sequences by N to provide enhanced-rate sequences;
processing a sum of said enhanced-rate sequences through said filter passband to thereby realize a filtered sequence; and
reducing the rate of said filtered sequence by N to thereby realize said digital code.

17. A method for converting an analog signal to a corresponding digital code, comprising the steps of:
converting said analog signal to N digital sequences in respective response to N interleaved clock signals that each have a common clock frequency; and
processing said digital sequences into said digital code with a filter passband that is contained within a single one of Nyquist zones whose widths are one half of said clock frequency and that is positioned to pass information contained in said analog signal;
wherein said processing step includes the steps of:
temporally offsetting at least one of said digital sequences into an offset digital sequence;
successively delaying at least one of said digital sequences into a successively-delayed digital sequence;
providing products of filter coefficients and sums of elements of said offset and successively-delayed digital sequences; and
successively summing said products to provide said digital code.

18. The method of claim 17, further including the step of configuring said offsetting delaying, providing and summing steps to form a symmetric, systolic filter.

19. The method of claim 17, wherein said digital sequences provide a digital representation of said analog signal and said processing step includes the step of positioning said filter passband to pass said digital representation.

20. The method of claim 17, wherein N is a selected one of two, three and four.

* * * * *